United States Patent [19]

Westwick

[11] Patent Number: 5,059,820

[45] Date of Patent: Oct. 22, 1991

[54] SWITCHED CAPACITOR BANDGAP REFERENCE CIRCUIT HAVING A TIME MULTIPLEXED BIPOLAR TRANSISTOR

[75] Inventor: Alan L. Westwick, Austin, Tex.

[73] Assignee: Motorola, Inc., Schaumburg, Ill.

[21] Appl. No.: 584,811

[22] Filed: Sep. 19, 1990

[51] Int. Cl.[5] ........................ H03K 3/01; H03K 17/56

[52] U.S. Cl. .............................. 307/296.6; 307/296.8; 307/491; 307/240; 323/314

[58] Field of Search .................. 307/296.6, 296.8, 310, 307/246, 240, 491; 328/127; 323/313, 314; 330/9

[56] References Cited

U.S. PATENT DOCUMENTS

| | | | |
|---|---|---|---|
| 3,976,896 | 8/1976 | Ryder | 307/296.6 |
| 4,355,285 | 10/1982 | Kelley et al. | 330/9 |
| 4,375,595 | 3/1983 | Ulmer et al. | 307/490 |
| 4,714,843 | 12/1987 | Smith | 328/127 |
| 4,742,292 | 5/1988 | Hoffman | 323/314 |
| 4,902,959 | 2/1990 | Brokaw | 323/314 |

OTHER PUBLICATIONS

"A Precision Curvature-Compensated CMOS Bandgap Reference", IEEE Journal of Solid State Circuits, vol. SC-18, No. 6, Dec. 1983, pp. 634–643.

*Primary Examiner*—Stanley D. Miller
*Assistant Examiner*—Richard Roseen
*Attorney, Agent, or Firm*—Robert L. King

[57] ABSTRACT

Time multiplexing two or more current sources to source current to a single bipolar transistor achieves a more stable Vbe input for a switched capacitor bandgap reference circuit. With the proper selection of switched capacitor sizes and current sources values to establish a Vbe voltage at the input of a differential amplifier, an output reference voltage can be achieved that is substantially independent of processing and temperature variations as well as circuit aging characteristics. The invention reduces, and in some cases, eliminates the need for trimming values of capacitance or resistance to achieve the desired output reference voltage.

8 Claims, 4 Drawing Sheets

9

SWITCHED CAPACITOR BANDGAP REFERENCE CIRCUIT HAVING A TIME MULTIPLEXED BIPOLAR TRANSISTOR

FIELD OF INVENTION

This invention relates generally to bandgap reference circuits, and more particularly, to switched capacitor bandgap reference circuits.

BACKGROUND OF THE INVENTION

A good reproducible and stable reference voltage for integrated circuits is the bandgap reference circuit. One form of a bandgap reference circuit is taught by Richard W. Ulmer and Roger A. Whatley in U.S. Pat. No. 4,375,595 entitled "Switched Capacitor Temperature Independent Bandgap Reference" and assigned to the assignee herein. There are several sources of error which may be introduced into an output reference voltage as a result of process variations. Examples of these errors include, but are not limited to, input offset voltages associated with the use of a differential amplifier, current source inaccuracies and capacitor value mismatches. As a result, there is typically a need to modify values of resistive or capacitive elements of a bandgap reference circuit by a technique known as "trimming" to achieve a desired reference voltage. Trimming includes, but is not limited to, laser trimming thin-film resistors, opening fusible links with high current, and trimming fusible links with lasers. The trimming methods include an initial testing of the circuit, trimming as required, followed by retesting to confirm any modification. These steps are costly in a high volume production environment.

SUMMARY OF THE INVENTION

Accordingly, there is provided, in one form, a switched capacitor bandgap reference circuit using a bipolar transistor portion, a current source portion, a capacitance portion, and an amplifier portion. The current source portion is coupled to the bipolar transistor portion to respectively provide a first and a second current to the bipolar portion during a first and a second time period. The current source portion time multiplexes the first and second currents thru the bipolar transistor portion. The capacitance portion is coupled to the bipolar transistor portion and the current source portion. The capacitance portion stores charge proportional to both a base-to-emitter voltage of the bipolar transistor portion when conducting the first current and a delta base-to-emitter voltage of the same bipolar transistor portion when conducting the first and second currents. The amplifier portion is coupled to the capacitance portion to provide a temperature stable reference voltage. These and other features, and advantages, will be more clearly understood from the following detailed description taken in conjunction with the accompanying drawings.

DESCRIPTION OF A PREFERRED EMBODIMENT

Figure 1:
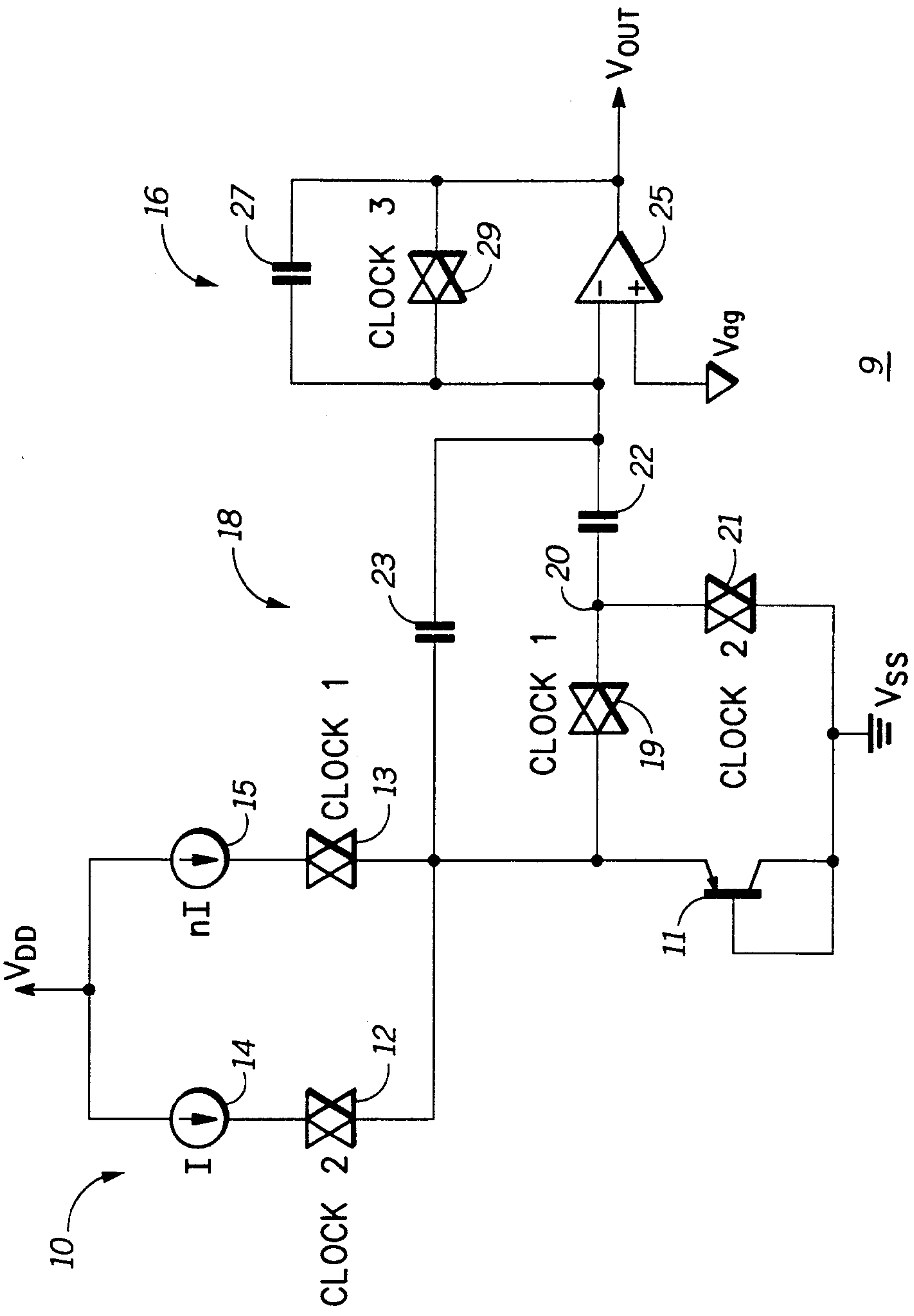
FIG. 1 illustrates in partial schematic form a bandgap reference circuit in accordance with the present invention.

Shown in FIG. 1 is a switched capacitor bandgap reference circuit 9 in accordance with the present invention. In general, bandgap reference circuit 9 comprises a bandgap reference portion 10, a switched capacitor network portion 18, and an amplifier portion 16. The bandgap reference portion 10, is comprised generally of a single bipolar transistor 11, switches 12 and 13, and current sources 14 and 15. In the illustrated form, all of the clocked switches are constructed to be conductive when the clocks are at a logic high value.

In the bandgap reference portion 10, current sources 14 and 15 each have a first terminal respectively connected to first terminals of switches 12 and 13. Current sources 14 and 15 each have a second terminal connected to a first power supply, $V_{dd}$. Current sources 14 and 15 are constructed to have different values of current sourcing capability, I and nI, respectively, where n is any number. Switches 12 and 13 are respectively controlled by clock signals labeled "Clock 2" and "Clock 1". The second terminals of current sources 12 and 13 are connected together and to an emitter of single bipolar transistor 11. The single bipolar transistor 11 has a base and a collector connected together and to a second power supply, Vss. In the illustrated form, supply voltage $V_{dd}$ is more positive than supply voltage $V_{ss}$.

In switched capacitor network portion 18 of the bandgap reference circuit, a switch 19 has a first terminal connected to the emitter of bipolar transistor 11 and a second terminal connected to a node 20. Switch 19 is controlled by clock 1. A switch 21 has a first terminal connected to node 20 and a second terminal connected to supply voltage Vss. Switch 21 has a control terminal and is controlled by clock 2. A capacitor 22 has a first electrode connected to the second terminal of switch 19 at node 20, and has a second electrode. A capacitor 23 has a first electrode connected to the emitter of bipolar transistor 11 and has a second electrode connected to the second electrode of capacitor 22.

In the amplifier portion 16 of the bandgap reference circuit, a differential amplifier 25 has a negative input connected to the second electrodes of capacitors 22 and 23. A positive input of differential amplifier 25 is connected to an analog ground voltage terminal labeled "$V_{ag}$". In the illustrated form, $V_{ag}$ has a voltage potential about halfway between $V_{dd}$ and $V_{ss}$. A capacitor 27 has a first electrode connected to the negative input of differential amplifier 25 and a second electrode connected to an output of differential amplifier 25 which provides an output reference voltage labeled "$V_{out}$". A switch 29 has a first terminal connected to the negative input of differential amplifier 25 and a second terminal connected to the output of differential amplifier 25. Switch 29 has a control terminal for receiving a clock signal labeled "Clock 3".

Figure 2:
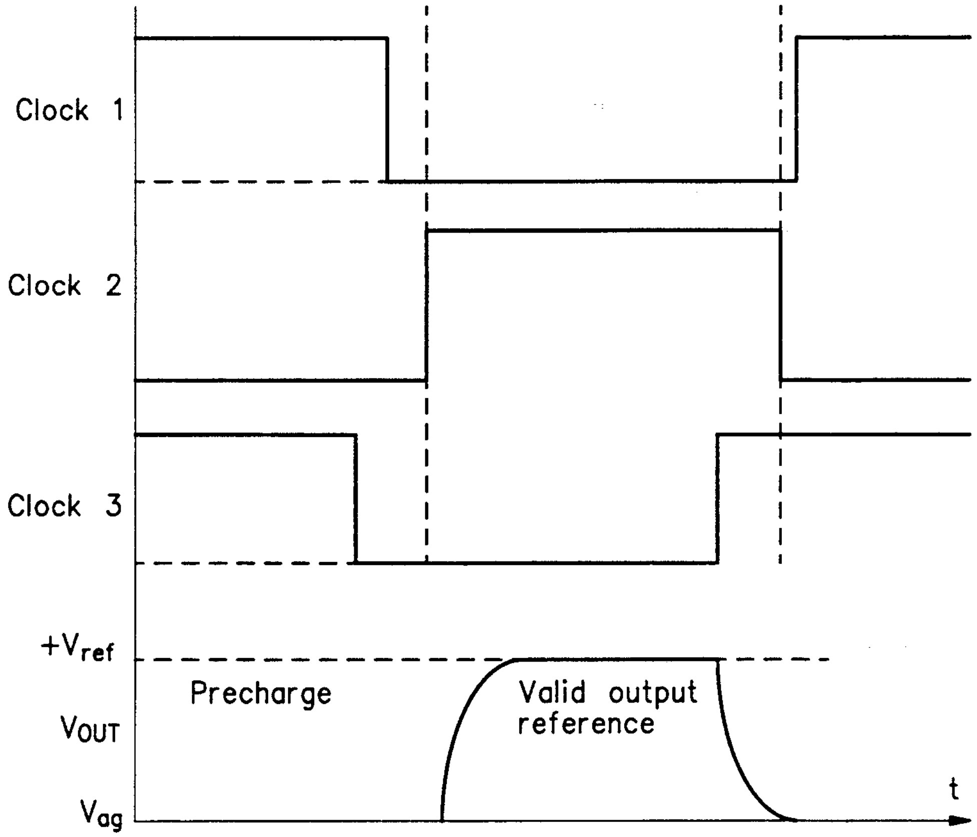
FIG. 2 illustrates the clocking signals for the switched capacitor bandgap reference circuit.

In operation, bandgap reference circuit 9 operates in two repeating modes: a precharge mode, and a valid output reference mode. Control signals illustrating the two modes are provided in FIG. 2. During the precharge mode, switch 13 couples current source 15 to the emitter of the bipolar transistor 11 establishing a voltage labeled "Vbe1" at the emitter of bipolar transistor 11 which is dependent on the current through the collector of bipolar transistor 11. During this same time period, switch 19 couples Vbe1 to node 20. When clock 3 is high, switch 29 is on, thereby connecting $V_{out}$ to the negative input of differential amplifier 25 as well as connecting the electrodes of capacitor 27 together to discharge capacitor 27. Therefore, during the precharge period an accurate reference voltage, Vbe1, having a negative temperature coefficient is established at node 20.

When clock 2 transitions to a logic high, the valid output reference mode begins. In this mode, current source 14 is coupled thru switch 12 to the emitter of bipolar transistor 11. Since current source 14 is of different value than current source 15, the current thru bipolar transistor 11 is different than in the precharge mode and will result in a different Vbe voltage, Vbe2, at the emitter of bipolar transistor 11. Also during the time period of the valid reference mode, switch 21 connects node 20 to power supply $V_{ss}$. This switching action results in a voltage division at the negative input of differential amplifier 25 that is inversely proportional to the capacitive values of capacitors 22 and 23. A ΔVbe, which is defined as the voltage difference between Vbe1 and Vbe2 is developed by the bandgap reference portion 10 and switched capacitor network portion 18. A portion of the ΔVbe is coupled to the negative input of differential amplifier 25 by means of voltage division from capacitors 22 and 23. The Vout of the differential amplifier changes in accordance with the voltage difference at its input terminals and the value of capacitor 27. As will be clear to those skilled in the art, the voltage Vbe1 will exhibit a negative temperature coefficient (NTC) and the ΔVbe will exhibit a positive temperature coefficient (PTC). The voltage at Vout is therefore given by the equation:

$$V_{out}=(C \cdot \mathrm{Vbe1}+K \cdot C \cdot \Delta \mathrm{Vbe})/A \cdot C \quad (1)$$

where K is capacitive ratio of capacitors C23 and C22, A is the capacitive ratio of capacitors C27 and C22 and C is the capacitive value of capacitor C22.

Equation one may be simplified to:

$$V_{out}=(\mathrm{Vbe}+K \cdot \Delta \mathrm{Vbe})/A \quad (2)$$

By time multiplexing a single bipolar transistor in circuit 9 to generate a Vbe and a ΔVbe, a significant source of error inherent in other switched capacitor bandgap reference circuits is eliminated. This invention has not only reduced or eliminated the need for using trimming methods to achieve the desired reference voltage, but additionally it provides a more stable reference voltage with respect to temperature and process variations, as well as circuit aging characteristics.

Figure 3A:
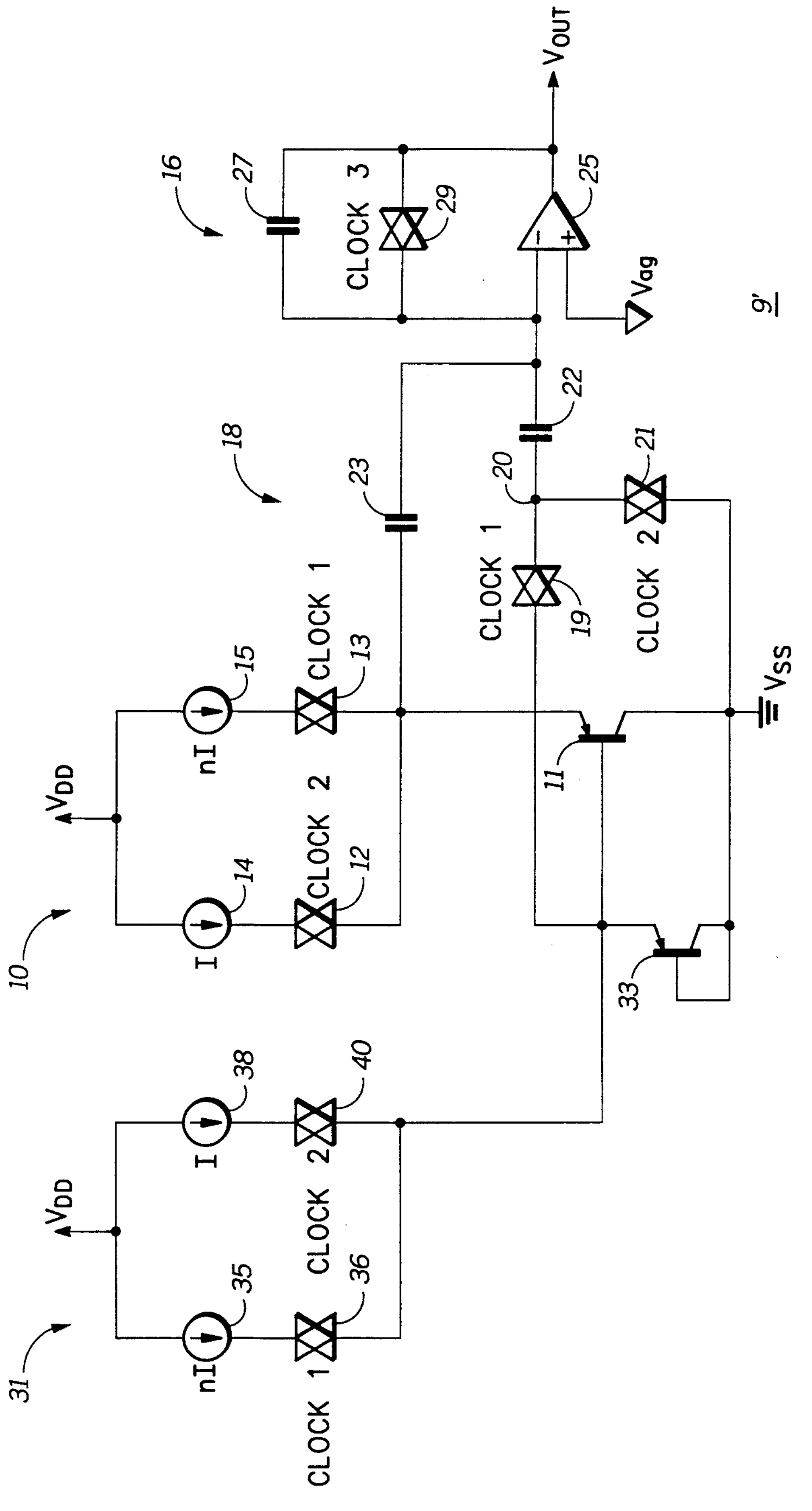
FIG. 3(A) illustrates in partial schematic form, another embodiment of the present invention.

Illustrated in FIG. 3(A) is a bandgap reference circuit 9' which is a modification of bandgap reference 9 of FIG. 1. Bandgap reference circuit 9' results in a Vbe1 utilizes additional time multiplexed current sources and an additional bipolar reference voltage that is independent of variations commonly encountered with low beta bipolar transistors.

Common elements between the bandgap reference circuits of FIG. 1 and FIG. 3(A) are identically numbered for convenience of comparison. In bandgap reference portion 31, a bipolar transistor 33 has a base and a collector connected together and to supply voltage $V_{ss}$, and has an emitter. A current source 35 has a first terminal connected to $V_{dd}$, and has a second terminal connected to a first terminal of a switch 36. A second current source 38 has a first terminal connected to $V_{dd}$, and has a second terminal connected to a first terminal of a switch 40. Current sources 35 and 38 respectively source currents equal to current sources 15 and 14. Switches 36 and 40 each have a control terminal for respectively receiving clock signals 1 and 2. A second terminal of switch 36 is connected to a second terminal of switch 40 and to the emitter of bipolar transistor 33. The emitter of bipolar transistor 33 is connected to the base of bipolar transistor 11. In addition, it should be noted that the first terminal of switch 19 is now connected to the base of bipolar transistor 11 rather than to the emitter as shown in FIG. 1.

In operation, the purpose of bandgap reference portion 31 is to provide a Vbe1 which is base current compensated for the switched capacitor bandgap reference circuit 9' as described below. This compensation base current may be necessary for manufacturing processes that have insufficient control of beta (current gain) for bipolar transistors to achieve a necessary stable Vbe reference voltage. As is known by those skilled in the art, controlling the collector current of a bipolar transistor results in an extremely stable Vbe for the bipolar transistor. This particular base current compensation technique works as follows. The collector current of bipolar transistor 33 is the sum of currents from the time multiplexed current sources, 29 and 30, along with the base current of bipolar transistor 11. Assuming clock 2 is active to enable both switches 12 and 40, the equation for the collector current of bipolar transistor 33 is therefore:

$$Ic33=Ib11-Ib33. \quad (3)$$

If the bipolar transistors 11 and 33 are constructed with similar area and layout techniques, and current sources 35 and 38 are equal to current sources 15 and 14, respectively, the base current of bipolar transistor 33 will be approximately equal to the base current of bipolar transistor 11. This reduces the collector current equation (3) for bipolar transistor 33 to:

$$Ic33=I. \quad (4)$$

With the base current being removed from equation (4), the effect of beta variations to bipolar transistor 33 is eliminated. Therefore, a very stable Vbe1' for the bandgap reference circuit 9' is provided. A Vbe2' is established at the emitter of bipolar transistor 11. The Vbe2' is the sum of Vbe from bipolar transistor 11 and Vbe of bipolar transistor 33. The Vbe of bipolar transistor 11 is not base current compensated, but the Vbe of bipolar transistor 33 is.

Another form of circuit 9' of FIG. 3(A) is the connection of the first electrode of capacitor 23 to the emitter of bipolar transistor 33 rather than to the emitter of bipolar transistor 11. This modification results in base current compensation of a ΔVbe' related to bipolar transistor 33 as well as a Vbe1' of bipolar transistor 33. Since in most applications, base current variations in the ΔVbe' nearly cancel one another out, circuit 9' typically performs minor adjustments to the error in the output reference voltage. A potential disadvantage of this noted modified form is that capacitor 23 must be increased in value by a factor of two to achieve the same previously attained voltage division at the negative input of differential amplifier 25, and to achieve the same output reference voltage at Vout.

Figure 3B:
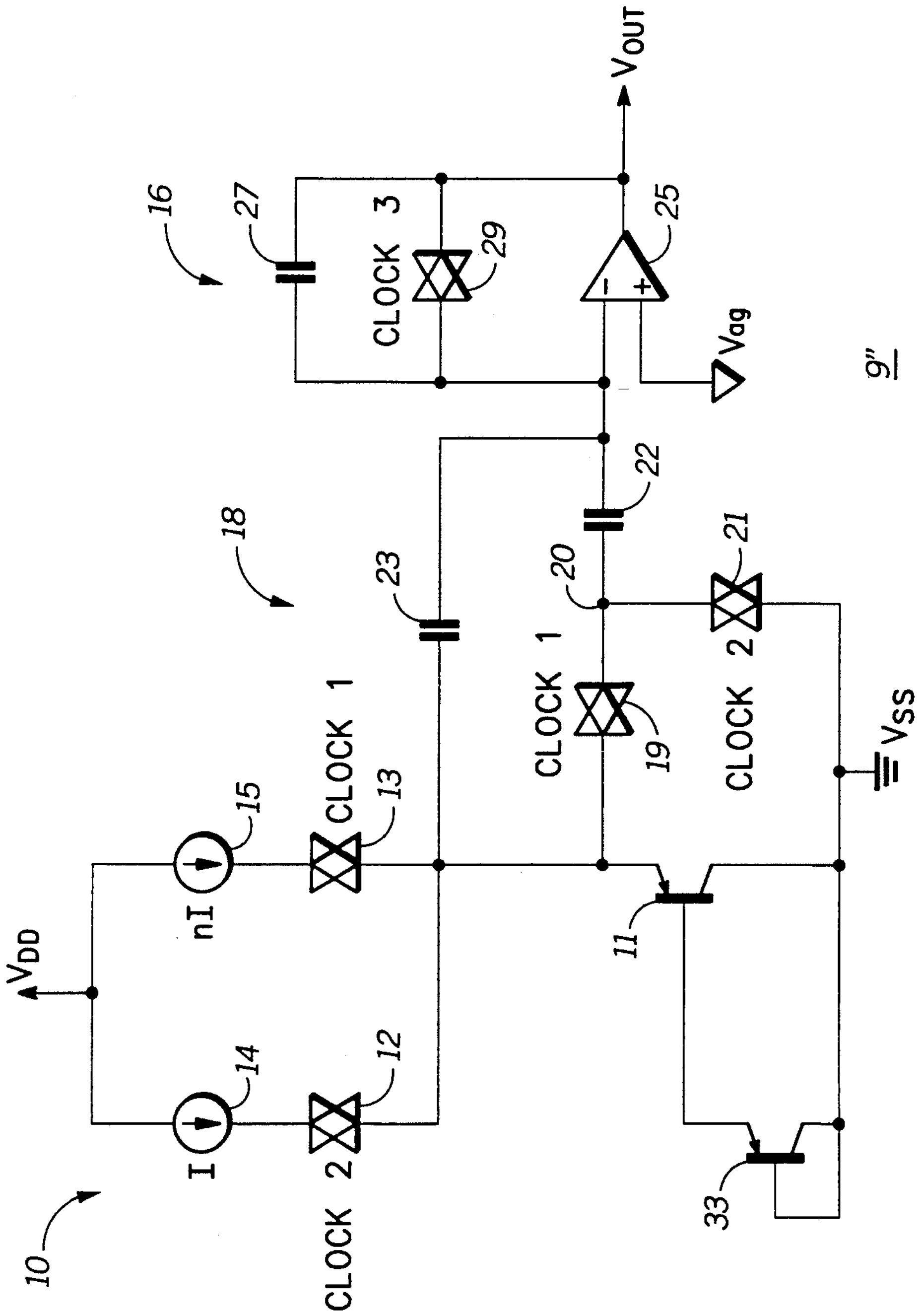
FIG. 3(B) illustrates in partial schematic form, yet another embodiment of the present invention.

FIG. 3(B) illustrates another embodiment of the present invention. Bandgap reference circuit 9″ of FIG. 3(B) is similar to circuit 9 of FIG. 1, and has fewer components than circuit 9′ of FIG. 3(A). Since the illustrated circuits 9, 9′, and 9″ have common elements between one another, the same components are again identically numbered in FIG. 3(B) for convenience of comparison. Bandgap reference circuit 9″ utilizes an additional bipolar transistor in bandgap reference portion 10 to establish a larger Vbe1 voltage at node 20.

In circuit 9″, bipolar transistor 33 has a base and a collector connected together and to $V_{ss}$, and has an emitter. The emitter of bipolar transistor 33 is connected to the base of bipolar transistor 11. In addition, it should be noted that the base of bipolar transistor 11 which was connected to $V_{ss}$ in circuit 9 of FIG. 1, is now connected to the emitter of bipolar transistor 33 in circuit 9″ of FIG. 3(B).

In operation, when clock 1 is at a logic high value, the Vbe1 voltage established at the emitter of bipolar transistor 11, which is the sum of Vbe voltages developed from bipolar transistors 11 and 33, is capatured at the first electrode of capacitor 22, node 20. To achieve the same input voltage in circuit 9″ at the negative input to differential amplifier 25 as was attained in circuit 9 of FIG. 1 during the valid output reference mode, the capacitive value of capacitors 22 and 23 must be reduced by a factor of two. Since capacitor 23 is generally the largest capacitor in bandgap reference circuits 9, 9′, and 9″, the reduction in size of capacitor 23 in circuit 9″ may be considered an advantage. However, a potential disadvantage of circuit 9″, is that an additional bipolar transistor is required.

It should be well understood that the present invention provides a switched capacitor bandgap reference voltage circuit which substantially eliminates output voltage error by having a time-multiplexed bipolar transistor. The time-multiplexing of a bipolar transistor eliminates errors caused by current mismatches between two bipolar transistors in switched capacitor bandgap reference circuits which derive a Vbe and a delta Vbe. As a result, device variations resulting from processing and other factors are minimized. The present invention eliminates the need to perform trimming of components to correct voltage error in the bandgap reference's output. Therefore, the present invention provides improved long term operational reliability along with reduced manufacturing and testing costs.

By now it should be apparent that there are many additional configurations to the invention described above. For example, the bipolar transistor whose base is connected to $V_{ss}$ may be connected to other reference voltages. Additional current sources and bipolar transistors can be added to achieve base current compensation for the Vbe and $\Delta$Vbe voltages. Differing base current compensation may be used. Other bipolar transistors may be used to increase the Vbe1 voltage to reduce the value of capacitance of capacitor 23. Specific NPN bipolar transistors may be used instead of PNP bipolar transistors or combinations thereof. Also, amplifiers other than a differential amplifier may be used. Additionally, methods of coupling nodes other than using the illustrated switches may be implemented. Also, switched capacitors may be replaced with resistors. It should also be well understood that the elements of the present invention may be implemented with differing types of transistors and transistors having different conductivities.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A switched capacitor bandgap reference circuit comprising:

bipolar transistor means;

current source means coupled to the bipolar transistor means for providing first and second currents to the bipolar transistor means during first and second time periods, respectively, the current source means time-multiplexing the first and second currents thru the bipolar transistor means respectively during two predetermined time periods;

capacitance means coupled to the bipolar transistor means and the current source means, the capacitance means storing charges proportional to both a base-to-emitter voltage of the bipolar transistor means when conducting the first current and a delta base-to-emitter voltage of the same bipolar transistor means as a result of conducting the second current subsequent to conducting the first current; and amplifier means coupled to the capacitance means for providing a temperature stable reference voltage.

2. The switched capacitor bandgap reference circuit of claim 1 wherein the current source means further comprise:

a first current source for providing the first current;

a first switch having a first terminal coupled to the first current source and a second terminal coupled to the bipolar transistor means;

a second current source for providing the second current; and a second switch having a first terminal coupled to the second current source and a second terminal coupled to the bipolar transistor means.

3. The switched capacitor bandgap reference circuit of claim 1 wherein the bipolar transistor means comprises a single bipolar transistor.

4. The switched capacitor bandgap reference circuit of claim 1 wherein the bipolar transistor means comprises at least two bipolar transistors having base-to-emitter junctions thereof connected in series.

5. A switched capacitor bandgap reference circuit having a time multiplexed bipolar transistor, comprising:

a first current source having a first terminal coupled to a first power supply voltage terminal, and a second terminal for providing a first current;

a second current source having a first terminal coupled to the first power supply voltage terminal, and a second terminal for providing a second current differing from the first current by a predetermined proportion;

a first switch having a first terminal coupled to the second terminal of the first current source, and a second terminal;

a second switch having a first terminal coupled to the second terminal of the second current source, and a second terminal;

bipolar transistor means coupled between the second terminals of the first and second switches and a second power supply voltage terminal for time multiplexing during two predetermined time periods conduction of the first and second currents thru an identical predetermined current path of the bipolar transistor means during the two time periods;

a first capacitor having a first electrode coupled to the second terminals of the first and second switches, and having a second electrode;

a third switch having a first terminal coupled to the second terminals of the first and second switches, and having a second terminal;

a second capacitor having a first electrode coupled to the second terminal of the third switch and having a second electrode coupled to the second electrode of the first capacitor;

a fourth switch having a first terminal coupled to the second terminal of the third switch, and having a second terminal coupled to the second power supply voltage terminal;

an amplifier having a first input coupled to the second electrodes of the first and second capacitors, a second input coupled to a reference voltage terminal, and an output for providing an output reference voltage;

a third capacitor having a first electrode coupled to the first input of the amplifier, and a second electrode coupled to the output of the amplifier; and a fifth switch having a first terminal coupled to the first input of the amplifier, and a second terminal coupled to the output of the amplifier.

6. The switched capacitor bandgap reference circuit of claim 5 wherein the bipolar transistor means further comprise:

a single bipolar transistor having an emitter coupled to the second terminals of the first and second switches, and a base and a collector connected together and to the second power supply voltage terminal.

7. The switched capacitor bandgap reference circuit of claim 5 wherein the bipolar transistor means further comprise:

a first bipolar transistor having an emitter coupled to the second terminals of the first and second switches, a base, and a collector coupled to the second power supply voltage terminal; and a second bipolar transistor having an emitter coupled to the base of the first bipolar transistor, and a base and a collector connected together and to the second power supply voltage terminal.

8. The switched capacitor bandgap reference circuit of claim 5 wherein the first, second, third, fourth and fifth switches each have a control terminal, the second and third switches receiving a first control signal and the first and fourth switches receiving a second control signal, the first and second control signals being nonoverlapping clock signals, the fifth switch receiving a third control signal.

* * * * *